(12) United States Patent
Matsuoka et al.

(10) Patent No.: US 7,268,433 B2
(45) Date of Patent: Sep. 11, 2007

(54) SEMICONDUCTOR DEVICE

(75) Inventors: Yoshihiro Matsuoka, Kawasaki (JP); Kazuyuki Imamura, Kawasaki (JP); Masao Oshima, Kawasaki (JP); Takashi Suzuki, Kawasaki (JP); Toyoji Sawada, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/256,273

(22) Filed: Oct. 24, 2005

(65) Prior Publication Data

US 2007/0001317 A1  Jan. 4, 2007

(30) Foreign Application Priority Data

Jul. 4, 2005  (JP) .............................. 2005-195432

(51) Int. Cl.
  *H01L 23/482* (2006.01)
  *H01L 23/485* (2006.01)
(52) U.S. Cl. ................. 257/774; 758/737; 758/786; 758/E23.02; 758/E23.019; 758/E23.015
(58) Field of Classification Search ................ 257/737, 257/738, 774, 773, 758, 786
See application file for complete search history.

(56) References Cited

U.S. PATENT DOCUMENTS 5,739,587 A    4/1998  Sato 5,923,088 A *  7/1999  Shiue et al. ................. 257/758
2003/0080421 A1* 5/2003 Sawai et al. ............... 257/737
2003/0122258 A1* 7/2003 Bobba et al. .............. 257/773
2003/0124768 A1* 7/2003 Hsu ............................ 438/108

FOREIGN PATENT DOCUMENTS

JP    2000-195866    7/2000
JP    2002-16065     1/2002

OTHER PUBLICATIONS

Office Action dated May 1, 2007 issued in corresponding Taiwan Application No. 94137336.

* cited by examiner

*Primary Examiner*—Evan Pert
*Assistant Examiner*—Victor A. Mandala, Jr.
(74) *Attorney, Agent, or Firm*—Westerman, Hattori, Daniels & Adrian, LLP.

(57) ABSTRACT

A wiring layer is provided on a semiconductor substrate and extends in a predetermined direction. An external connection electrode terminal is provided on the wiring layer through a plurality of column-shaped conductors. The column-shaped conductors are located under the external connection electrode terminal. A density of arrangement of the column-shaped conductors is varied according to a direction of extension of the wiring layer.

23 Claims, 14 Drawing Sheets

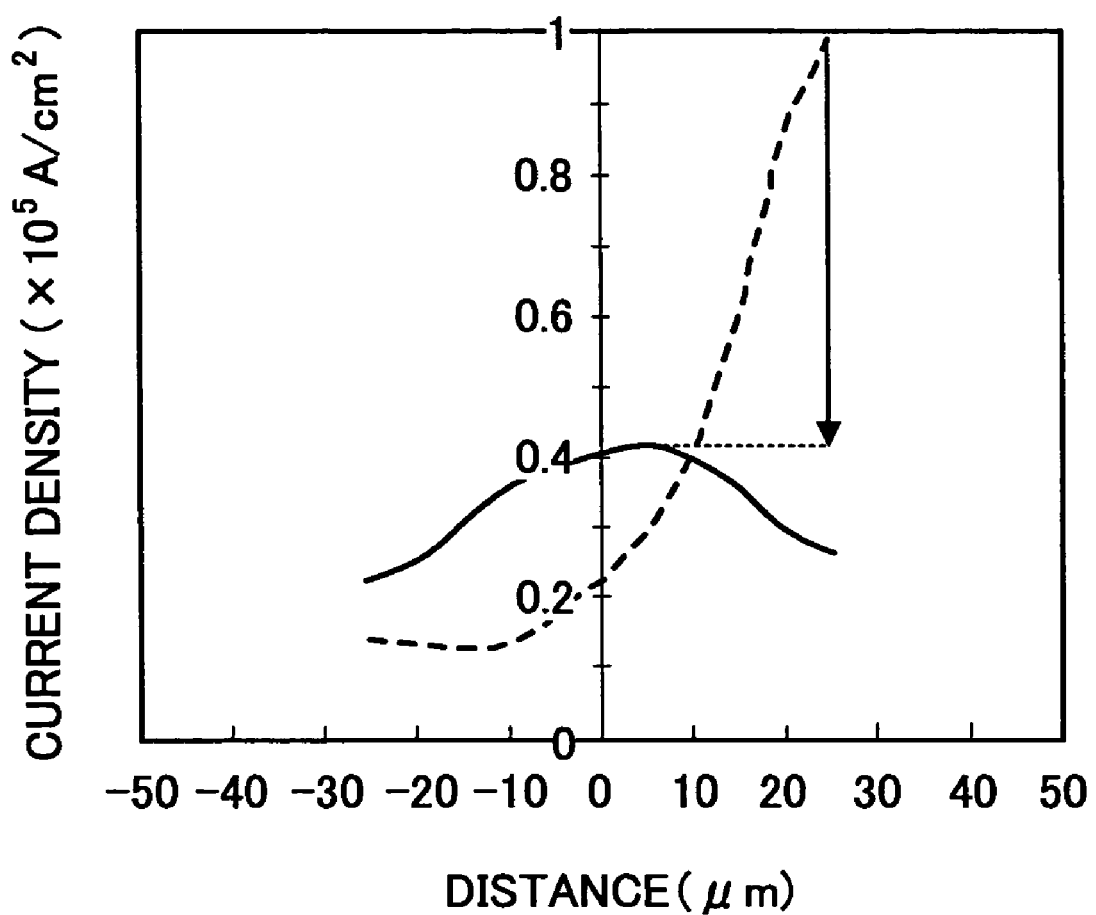

SEMICONDUCTOR DEVICE

BACKGROUND OF THE INVENTION

1. Field of the Invention

The present invention relates to a semiconductor device and, more particularly, to a connection structure of an external connection electrode terminal portion of a semiconductor element.

2. Description of the Related Art

In order to achieve miniaturization, high-performance and low-cost for electronic equipments, there is a demand for miniaturization, higher-performance and low-cost in semiconductor devices to be mounted on the electronic equipments. As one of external connection electrode terminal structures of such a semiconductor device, there is a structured using a solder bump. Thus, with such a demand for miniaturization of the semiconductor devices, a solder bump as an external connection electrode terminal has also been miniaturized and reduced in a diameter.

On the other hand, an amount of electric current flowing in such a semiconductor device tends to be increased so as to achieve a higher-speed operation of the semiconductor device. Thus, a current density of a current flowing through one solder bump is increased, which causes an electro-migration in a solder material constituting the solder bump and/or a foundation metal layer of the solder bump. Accordingly, there is a high possibility of a void (cavity) being generated in the solder bump. An existence of such a void may decrease a cross-sectional area of a current path in the solder bump, which results in an increase in an electric resistance. Thus, the existence of the void gives bad influences to an operation speed of the semiconductor device and also results in a decrease in reliability of the semiconductor device.

As a solder material for the solder bump, a so-called lead-free solder material has become widely used. Such a lead-free solder material is considered to have a lower resistance to electro-migration than a conventional lead-containing solder.

FIG. 1 shows an example of a solder bump portion of a semiconductor device having external connection electrode terminals formed by solder bumps.

In FIG. 1, a terminal pad portion 2 is formed in an aluminum (Al) wiring layer formed on one of main surfaces of a semiconductor substrate 1. A solder bump 7 formed of a tin (Sn)-silver (Ag) solder is provided on the terminal pad portion 2 via a foundation metal layer 6 constituted by a titanium (Ti) layer 3, a copper (Cu) layer 4 and a nickel (Ni) layer 5. An area where the terminal pad portion 2 and the foundation metal layer 6 are in contact with each other is defined by a surface protective film containing a passivation layer 8 formed of silicon nitride and a polyimide layer 9 covering the passivation layer 8.

In the above-mentioned external connection electrode terminal structure, an electric current may concentrated in a portion from which the wiring layer 21 extends, that is, at an end portion of the foundation metal layer 6 in a connection area where the foundation metal layer is connected to the wiring layer 21 under the foundation metal layer 6 of the external connection electrode terminal, as illustrated in FIG. 2. That is, electrons ($e^-$) flowing into the solder bump 7 are concentrated at the end portion of the foundation metal layer 6, and electro-migration may occur in the solder bump 7 and/or the foundation metal layer 6. As a result, a void (cavity) 22 may be formed inside the solder bump 7.

It should be noted that active elements and/or passive elements are formed by a normal semiconductor process inside the semiconductor substrate 1 shown in FIG. 1. Additionally, a so-called multi-layer wiring structure is provided on the main surface of the semiconductor substrate 1, and the active elements and/or the passive elements are electrically connected to each other. The terminal pad portion 2 for external connection is selectively provided in the middle of the wiring layer or an end of the wiring layer.

The following Patent Documents disclose the above-mentioned bump structure.

Patent Document 1: Japanese Laid-Open Patent Application No. 2000-195866

Patent Document 2: Japanese Laid-Open Patent Application No. 2002-16065

As mentioned above, electro-migration may occur in the external connection electrode terminal and/or the foundation metal layer under the external connection electrode terminal due to local concentration of an electric current flowing between the external connection electrode terminal and the wiring layer in the connection portion between the wiring layer and the external connection electrode terminal provided on one of the main surfaces of the semiconductor board. As a result, a void (cavity) is generated inside the bump constituting the external connection electrode terminal. This may invite an increase in a resistance of the external connection electrode terminal portion, and further a decrease in reliability of the semiconductor device.

Therefore, in the connection portion between the wiring layer and the external connection electrode terminal, it is required to acquire a connection structure, which does not have a possibility of generating a local concentration of an electric current.

SUMMARY OF THE INVENTION

It is a general object of the present invention to provide an improved and useful semiconductor device in which the above-mentioned problems are eliminated.

A more specific object of the present invention is to provide a connection structure in which no local concentration of an electric current occurs in a connection portion between a wiring layer and an external connection electrode terminal.

In order to achieve the above-mentioned objects, there is provided according to one aspect of the present invention a semiconductor device comprising: a wiring layer provided on a semiconductor substrate and extending in a predetermined direction; and an external connection electrode terminal provided on the wiring layer through a plurality of column-shaped conductors, wherein the column-shaped conductors are arranged in an area defined by a connection opening.

Additionally, there is provided according to another aspect of the present invention a semiconductor device comprising: a wiring layer provided on a semiconductor substrate and extending in a predetermined direction; and an external connection electrode terminal provided on the wiring layer through a plurality of column-shaped conductors, wherein the column-shaped conductors are located under the external connection electrode terminal, and a density of arrangement thereof is varied according to a direction of extension of the wiring layer.

Further, there is provided according to another aspect of the present invention, a semiconductor device comprising: a wiring layer provided on a semiconductor substrate via a first insulating layer and extending in a predetermined direction; an external connection electrode terminal provided on the wiring layer via a second insulating layer; and a plurality of column-shaped conductors provided in the second insulating layer, wherein the column-shaped conductors are located under the external connection electrode terminal and a density of arrangement thereof is varied according to a direction of extension of the wiring layer.

According to the present invention, the column-shaped conductors electrically connect the wiring layer and the external connection electrode terminal with each other. The column-shaped conductors can be located at any selected positions so as to prevent a local concentration of an electric current flowing between the wiring layer and the external connection electrode terminal, thereby preventing generation of electro-migration in the external connection electrode terminal and/or a foundation metal layer of the external connection electrode terminal. Accordingly, a void (cavity) is not formed inside a solder bump, which constitutes the external connection electrode terminal, and, thus, there is no increase in a resistance of the external connection electrode terminal portion or there is no decrease in reliability of the semiconductor device.

Other objects features and advantages of the present invention will become more apparent from the following detailed description when read in conjunction with the accompanying drawings.

BRIEF DESCRIPTION OF THE DRAWINGS

FIG. 9 is a graph showing a result of simulation of changes in a density of an electric current flowing according to a distance from a center of a bump when the column-shaped conductors are arranged as shown in FIG. 8;

DETAILED DESCRIPTION OF THE PREFERRED EMBODIMENTS

A description will now be given, with reference to the drawings, of an embodiment of the present invention.

Figure 3:
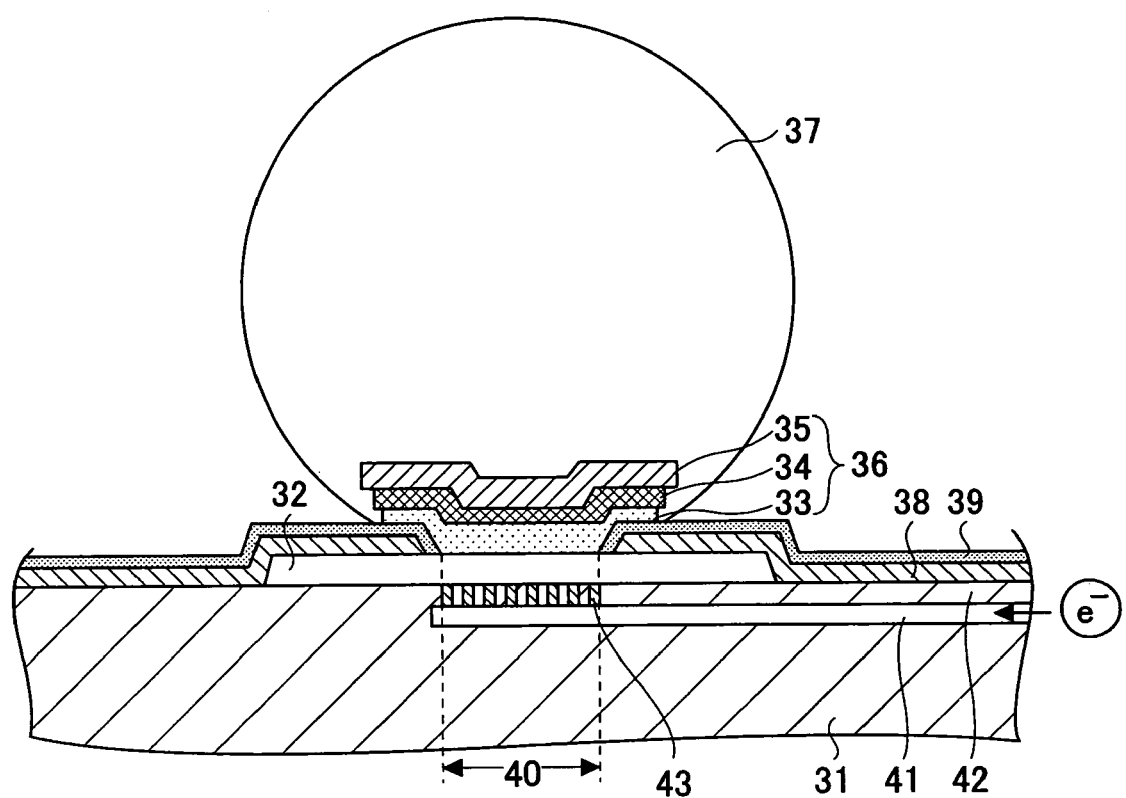
FIG. 3 is a cross-sectional view of an external connection electrode terminal of a semiconductor device according to an embodiment of the present invention.

FIG. 3 shows a structure of a solder bump portion of a semiconductor device according to the embodiment of the present invention, the semiconductor device having an external connection electrode terminal formed by a solder bump as a wiring structure of the semiconductor device.

In FIG. 3, a terminal pad portion 32 is formed in an aluminum (Al) wiring layer formed on one of main surfaces of a semiconductor substrate 31. A solder bump 37 formed of a tin (Sn)-silver (Ag) solder is provided on the terminal pad portion 32 via a foundation metal layer 36 constituted by a titanium (Ti) layer 33, a copper (Cu) layer 34 and a nickel (Ni) layer 35.

An area where the terminal pad portion 32 and the foundation metal layer 36 are in contact with each other is defined by a surface protective film containing a passivation layer 38 formed of silicon nitride and a polyimide layer 39 covering the passivation layer 38. A connection opening 40 is defined by the polyimide layer 39 covering the passivation layer 38.

In the present embodiment, a wiring layer 41 is provided as a wiring layer for the terminal pad portion under the terminal pad portion 32 in the above-mentioned external connection electrode terminal structure. The wiring layer 41 and the terminal pad portion 32 are electrically and mechanically connected by a plurality of column-shaped conductors 43 selectively provided by penetrating through an inter-layer insulating layer 42 in an area corresponding to (an area directly under) the area defined by the connection opening 40. It should be noted that the wiring layer 41 is formed of aluminum (Al) or copper (Cu), and the column-shaped conductors (plugs) 43 are formed of tungsten (W), aluminum (Al) or copper (Cu).

According to the above-mentioned structure, an electric current flowing between the wiring layer 41 and the solder bump 37 of the external connection electrode terminal flows through the plurality of column-shaped conductors (tungsten plugs) 43 while being dispersed. Accordingly, there is no local concentration in the electric current flowing between the wiring layer 41 and the external connection electrode terminal in the connection portion between the wiring layer and the external connection electrode terminal. That is, the current density of the electric current flowing in the contact portion between the terminal pad portion 32 and the foundation metal layer 36 and the contact portion between the foundation metal layer 36 and the solder bump 37 is uniformized, which results in the density of electrons (e⁻) flowing into the solder bump 37 being uniformized. Thereby, generation of electro-migration is prevented in the external connection electrode terminal and/or the foundation metal layer 36 of the external connection electrode terminal.

As a result, there is no void (cavity) formed inside the bump which constitutes the external connection electrode terminal. Thus, there is no increase in the resistance of the external connection electrode terminal portion and there is no decrease in reliability of the semiconductor device.

It should be noted that active elements and/or passive elements are formed by a normal semiconductor process inside the semiconductor substrate 31 shown in FIG. 3. Additionally, a so-called multi-layer wiring structure is provided on the main surface of the semiconductor substrate 31 so that the active elements and/or the passive elements are electrically connected with each other (detailed structure is not illustrated).

The terminal pad portion 32 for external connection is selectively provided in the middle or an end of the wiring layer. Additionally, the foundation metal layer 36 is not limited to the above-mentioned stacked structure of titanium (Ti) layer/copper (Cu) layer/nickel (Ni) layer, and can be a combination of elected metals having a shielding effect between the solder bump 37 and the terminal pad portion 32, if necessary.

Further, the solder bump 37 is not limited to the tin (Sn)-silver (Ag) solder, and may be a tin based alloy (solder) such as tin (Sn)-bismuth (Bi).

Figure 4:
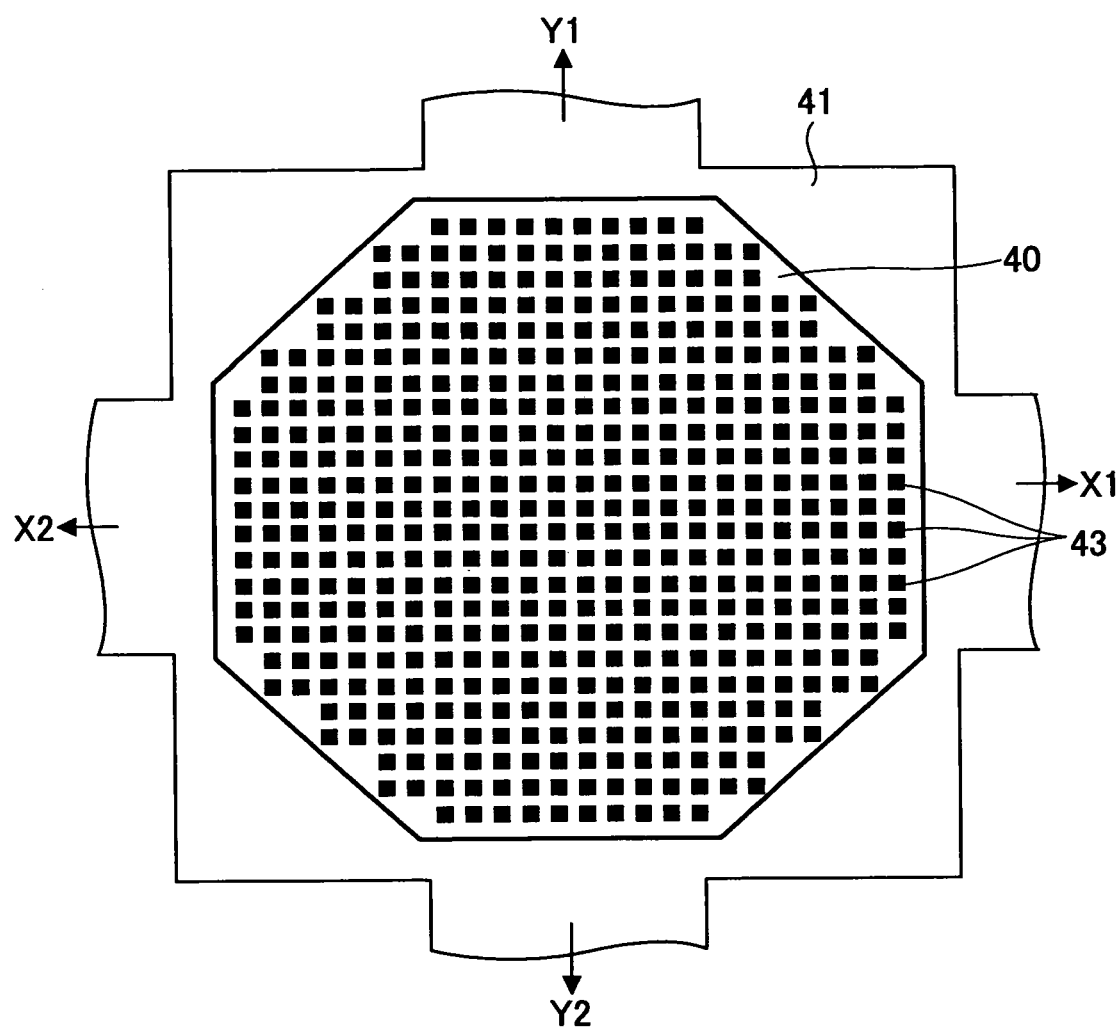
FIG. 4 is a plan view of an example of column-shaped conductors arranged at an entirely uniform density.

FIG. 4 shows a state where the plurality of column-shaped conductors (tungsten plugs) 43 are provided at an entirely uniform density in the area defined by the connection opening 40, that is, an inter-layer connection area. In FIG. 4, portions indicated solid black squares are the column-shaped conductors (tungsten plugs) 43. The cross-section of each of the column-shaped conductors (tungsten plugs) 43 is a generally circular shape in a practical device.

Figure 1:
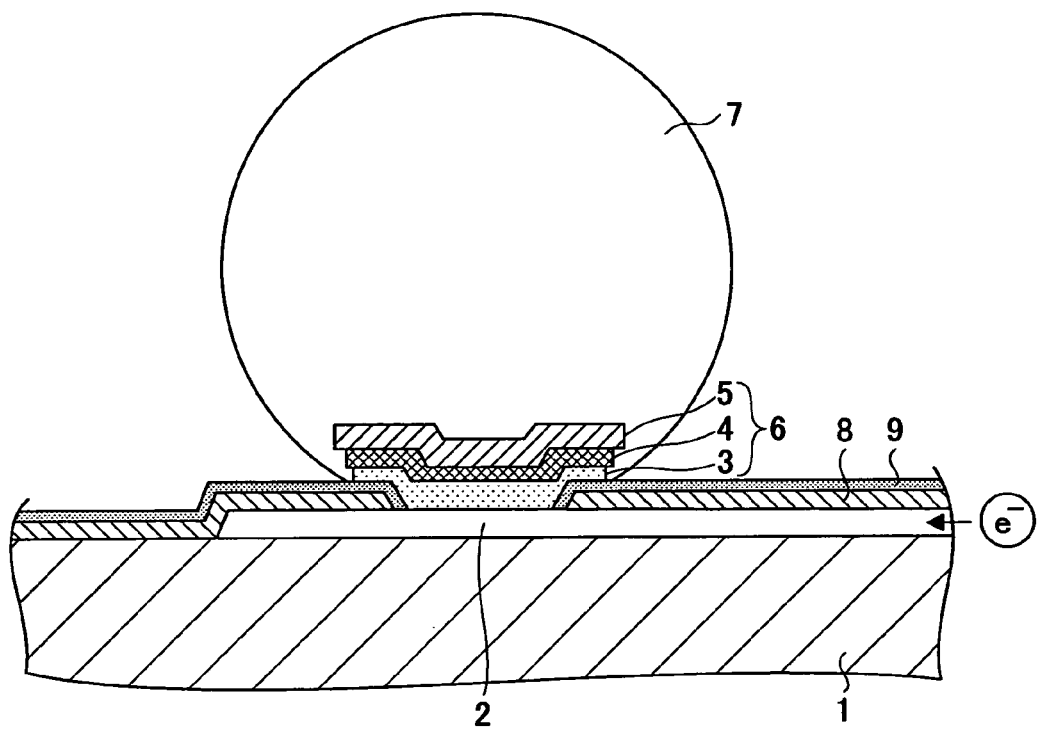
FIG. 1 is a cross-sectional view of a conventional external connection electrode terminal.
Figure 5:
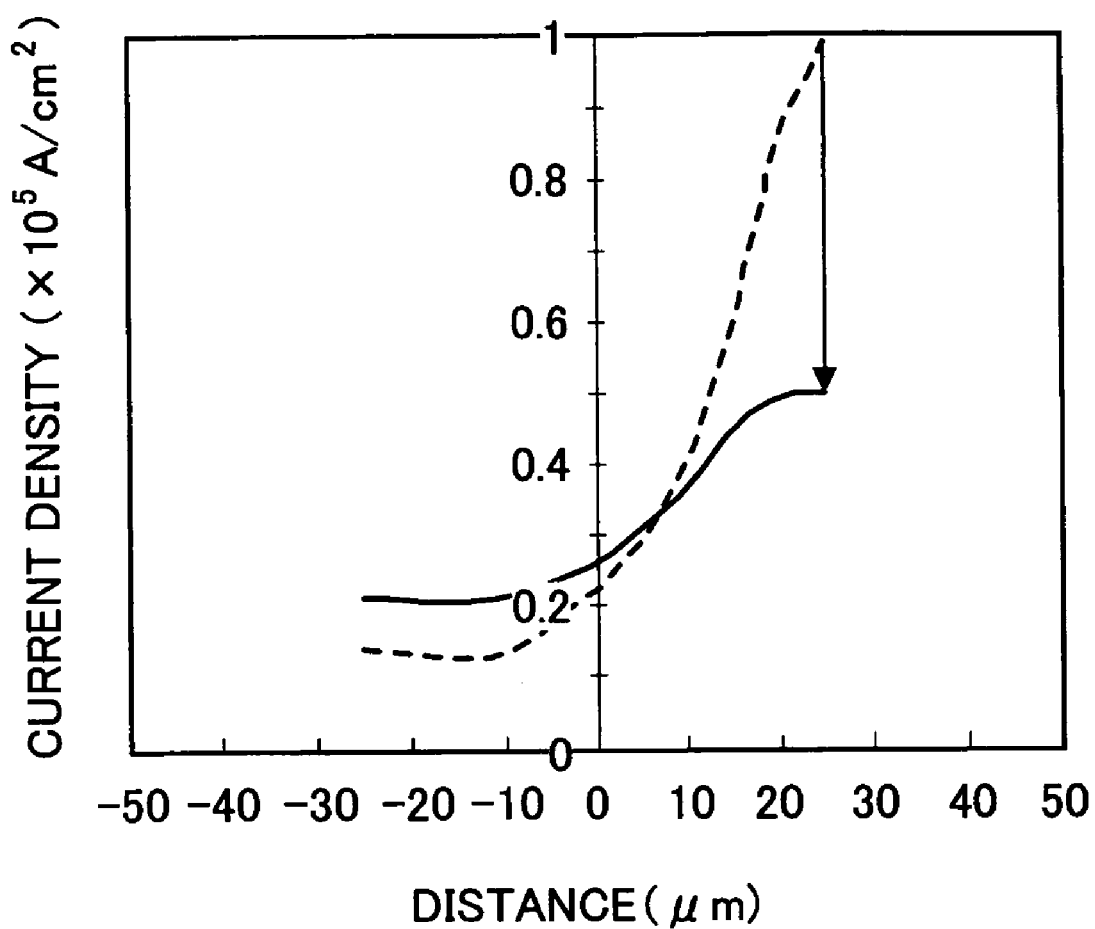
FIG. 5 is a graph showing a result of simulation of changes in a density of an electric current flowing according to a distance from a center of a bump when the column-shaped conductors are arranged as shown in FIG. 4.

FIG. 5 shows a result of simulation to obtain changes in a current density of an electric current (unit: $\times 10^5$ A/cm$^2$) flowing according to a distance from the center of the solder bump 37 in the example show in FIG. 4. IN FIG. 5, a solid line indicates a current density when the column-shaped conductors 8 tungsten plugs) 43 are arranged as shown in FIG. 4, and a dotted line indicates a current density of a case of the conventional bump connection structure shown in FIG. 1. It should be noted that, in FIG. 5, the vertical axis represents the current density, and the horizontal axis represents a distance (unit: μm) from the center of the bump 37.

Figure 2:
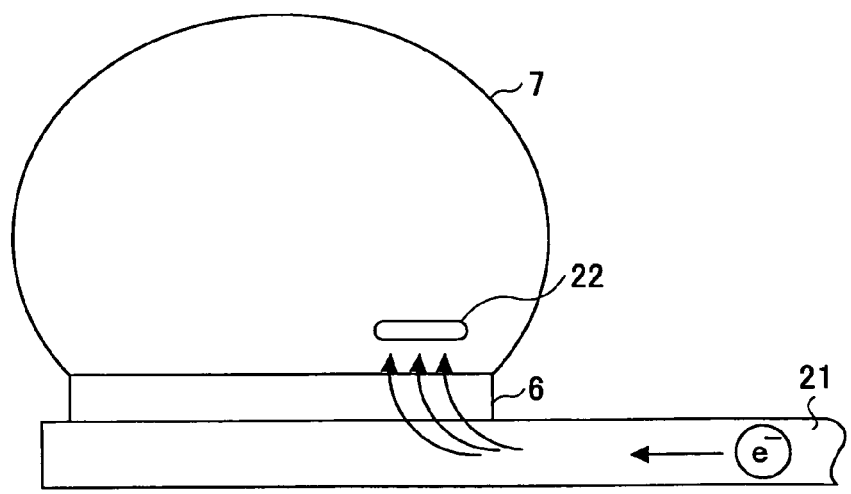
FIG. 2 is an illustration of the conventional external connection electrode terminal.

In the simulation, the diameter of the joined portion of the bump 37 was set to 50 μm, which is nearly equal to the diameter of the solder bump 37. Additionally, the direction of flow of electrons is regarded as one direction, and is set so that electrons flow from a side where the distance of the horizontal axis of FIG. 5 is positive value to a side where the distance is a negative value. That is, the right end of the solder bump 7 shown in FIG. 1 and FIG. 2 corresponds to a position of 25 μm of the horizontal axis in FIG. 5, and the left side of the solder bump 37 corresponds to −25 μm.

As apparent from FIG. 5, the current density at the left end of the solder bump 37 was a value which reaches $1 \times 10^5$ A/cm$^2$ in the conventional structure indicated by the dotted line, while the current density was about $0.5 \times 10^5$ A/cm$^2$, which value was reduced to about one half. Additionally, at the right end of the solder bump 37, the current density according to the wiring structure according to the present embodiment indicated by the solid line is higher than the current density of the conventional bump wiring structure indicated by the dotted line. Thus, it was confirmed that the current density of the electric current flowing through the solder bump 37 is entirely uniformized by using the wiring structure shown in FIG. 4.

Then, current density distributions under the following conditions were obtained by simulation using the arrangement of the column-shaped conductors (tungsten plugs) 43 shown in FIG. 4.

1) A case where a current of 600 mA flows in the X1-direction.

2) A case where a current of 300 mA flows in each of the X1-direction and the X-2 direction.

3) A case where a current of 300 mA flows in each of the X1-direction and the Y-1 direction.

4) A case where a current of 200 mA flows in each of the X1-direction, the Y-1 direction and the X-2 direction.

5) A case where a current of 150 mA flows in each of the X1-direction, Y1-direction, X2-direction and Y2-direction.

In the above-mentioned cases 1)-5), the whole current flowing through the bump 37 was set to 600 mA.

Figure 6A:
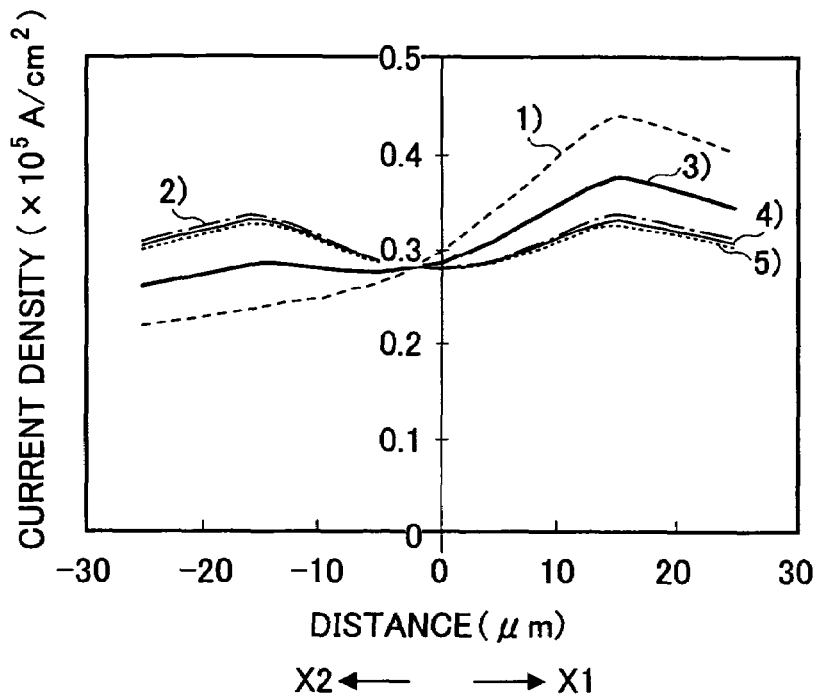
FIGS. 6A and 6B are graphs showing results of simulation of changes in a density of an electric current flowing according to a distance from a center of a bump when the column-shaped conductors are arranged as shown in FIG. 4.
Figure 6B:
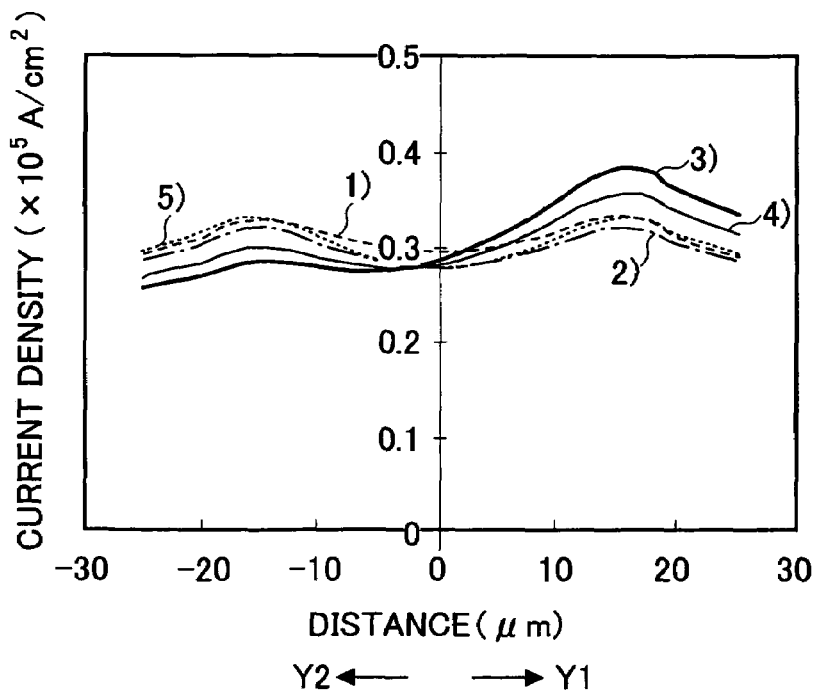

FIGS. 6A and 6B are graphs showing the results of the simulation. FIG. 6A shows a current density distribution in the X1-X2 direction, and FIG. 6B shows a current density distribution in the Y1-Y2 direction.

As shown in FIG. 6A, in the conditions 2), 4) and 5), in which the current flows in both the X1-direction and the X2-direction, the curve of the current density distribution in the X1-X2 direction is almost flat and symmetric, and the current density is relatively uniform.

Moreover, as shown in FIG. 6B, in the condition 5), in which the current flows in both the Y1-direction and the X2-direction, and the conditions 1) and 2), in which the current does not flow in both the Y1-direction and the X2-direction, the curve of the current density distribution in the X1-X2 direction is almost flat and symmetric, and the current density is relatively uniform.

From the results of the simulation shown in FIG. 6A and FIG. 6B, it was found that when a current flows in one of the opposite directions in the case where the column-shaped conductors 43 are arranged uniformly, the current density in the one of the directions becomes large.

That is, it was found that when the column-shaped electric conductors 43 are arranged uniformly, the current density distribution can be relatively uniform if a condition is set where a current flows in both opposite directions or a current does not flow in both opposite directions.

Figure 7:
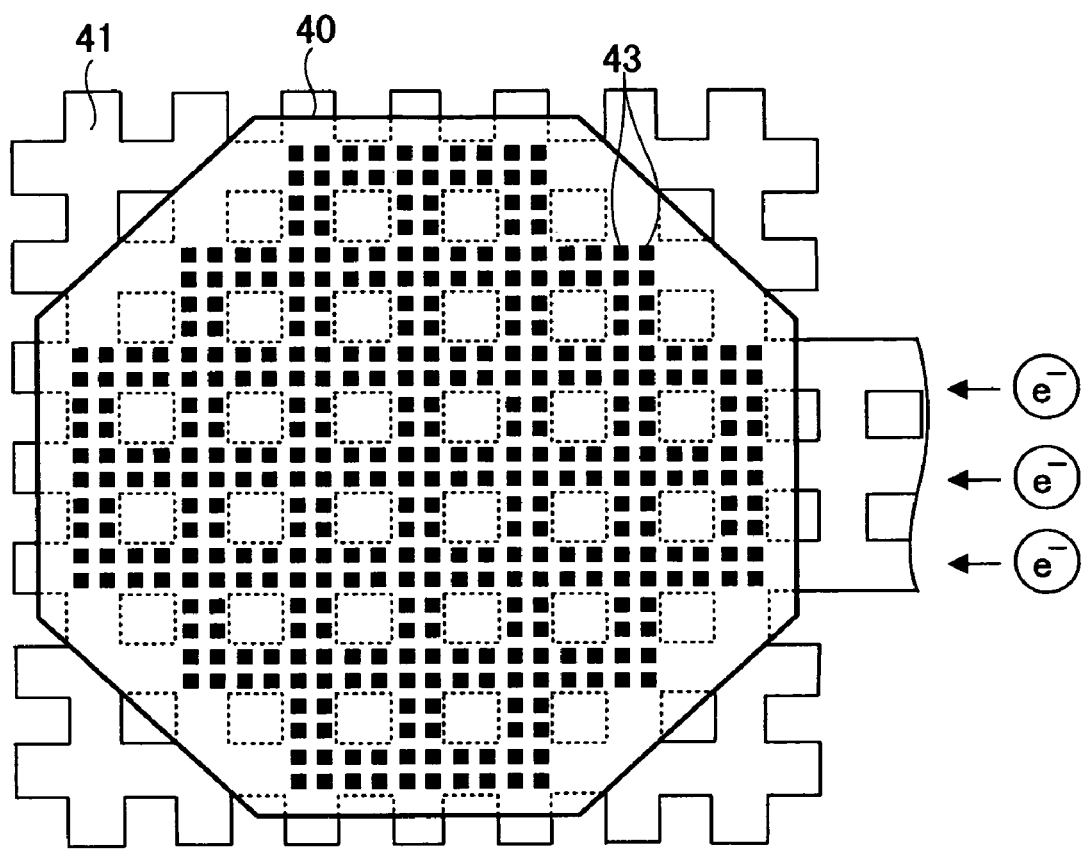
FIG. 7 is a plan view of an example in which the wiring shown in FIG. 4 is formed in a mesh pattern.

It should be noted that it is general to form the wiring layer 41 shown in FIG. 4 by copper or aluminum as mentioned above and to form wiring layer 41 in a flat-plate shape. However, the wiring layer 41 may be formed in a mesh pattern (grid pattern) as shown in FIG. 7. In such a case, the column-shaped conductors 43 are provided on the wiring forming the mesh pattern.

In the present embodiment, a larger effect can be obtained by arranging the column-shaped conductors (tungsten plugs) 43 in accordance with a flow of an electric current shown in FIG. 3. That is, an attempt is made to further uniformize the current density by setting the arrangement of the column-shaped conductors (tungsten plugs) 43 to the arrangement shown in FIG. 8. The column-shaped conductors 43 are located under the external connection electrode terminal and a density thereof is varied in accordance with the direction in which the wiring layer 41 extends. In the structure shown in FIG. 8, the density of arrangement of the column-shaped conductors 43 is gradually reduced toward a direction (a direction of flow of the electric current) from which electrons (e$^-$) flow.

Figure 8:
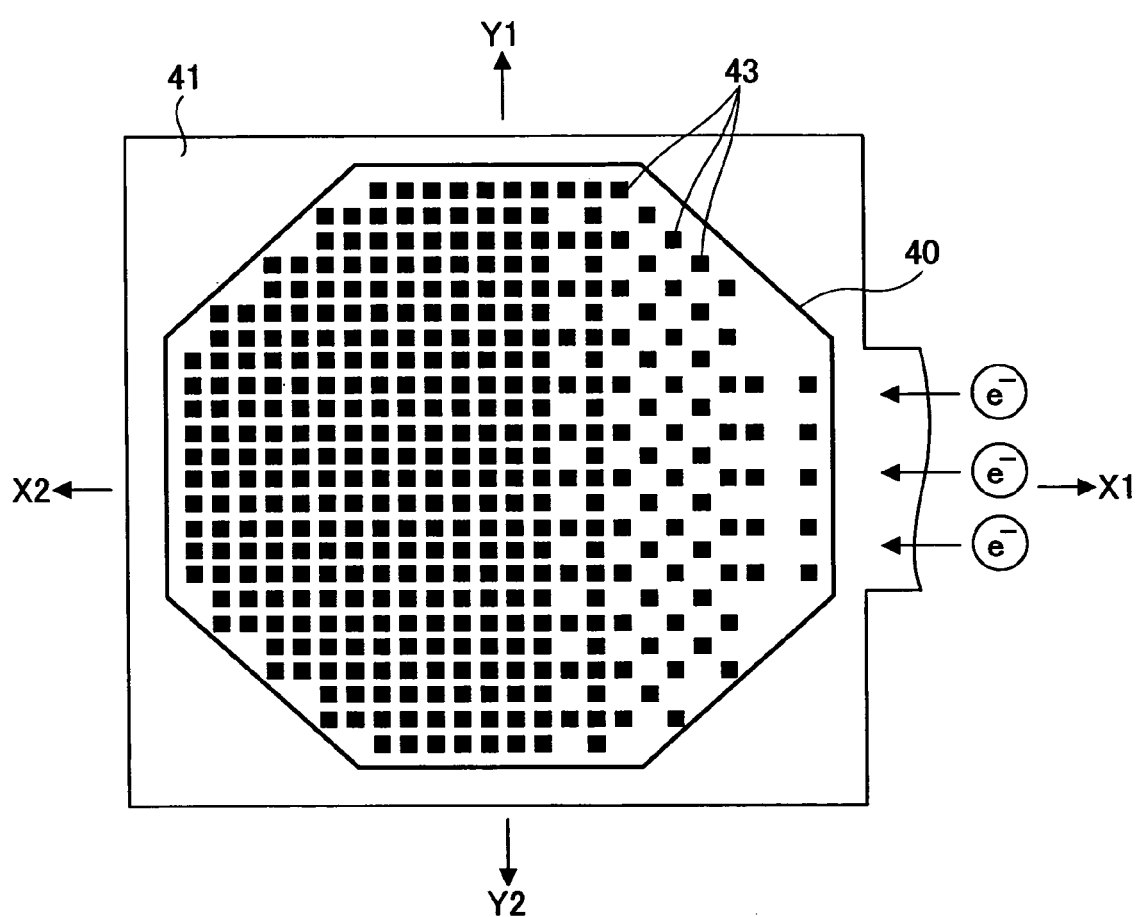
FIG. 8 is a plan view of an example where a density of the column-shaped conductors is gradually decreased toward a direction from which electrons flow.

In FIG. 8, when electrons (e$^-$) flow from the right-hand side, the density of the column-shaped conductors 43 is gradually decreased from the center of the solder bump 37 (that is, the center of the metal layer 10) toward the right-hand side. By using such an arrangement of the column-shaped conductors 43, when electrons e-flow from one direction (the right-hand side in FIG. 8) of the wiring layer 41, the current density on the right-hand side is decreased since the density of arrangement of the column-shaped conductors 43 on the right-hand side of the solder bump 37

(right-had side of the foundation metal layer), where electrons (e⁻) tend to be concentrated, is smaller than that of the left-hand portion including the central portion, thereby increasing the current density near the central portion.

FIG. 9 shows the result of simulation of changes in the current density of the electric current flowing according to a distance from the center of the solder bump 37 if the case where the column-shaped conductors (tungsten plugs) 43 are arranged as shown in FIG. 8. In FIG. 9, a solid line indicates the current density when the column-shaped conductors 43 are arranged as shown in FIG. 8, and a dotted line indicates the current density in the conventional connection structure shown in FIG. 1.

As shown in FIG. 9, the current density in the case where the column-shaped conductors 43 are arranged as shown in FIG. 8 shows a convex curve having a maximum of about $0.42 \times 10^5$ A/cm$^2$ near the center (position of a distance of 0) and reduced on both sides as indicated by the solid line. On the other hand, the current density on the right end of the solder bump 37 in the conventional wiring structure is as high as it reaches $1 \times 10^5$ A/cm$^2$. Comparing the maximum current densities, the maximum current density in the case of the arrangement of the column-shaped conductors 43 as shown in FIG. 8 is reduced from the maximum current density in the conventional wiring structure by about 58%, thereby uniformizing the current density over the entire solder bump 37.

Although the arrangement of the column-shaped conductors 43 shown in FIG. 8 is a case where electrons flows from one direction, if electrons flows from an opposite side (flow from opposite two directions), the density of arrangement of the column-shaped conductors 43 may be reduced toward the opposite side, thereby uniformizing the current density.

Then, current density distributions under the following conditions were obtained by simulation using the arrangement of the column-shaped conductors (tungsten plugs) 43 shown in FIG. 8.

1) A case where a current of 600 mA flows in the X1-direction.
2) A case where a current of 300 mA flows in each of the X1-direction and the X-2 direction.
3) A case where a current of 300 mA flows in each of the X1-direction and the Y-1 direction.
4) A case where a current of 200 mA flows in each of the X1-direction, the Y-1 direction and the X-2 direction.
5) A case where a current of 150 mA flows in each of the X1-direction, the Y1-direction, the X2-direction and the Y2-direction.

In the above-mentioned cases 1)-5), the whole current flowing through the bump 37 via the foundation metal layer 36 was set to 600 mA.

Figure 10A:
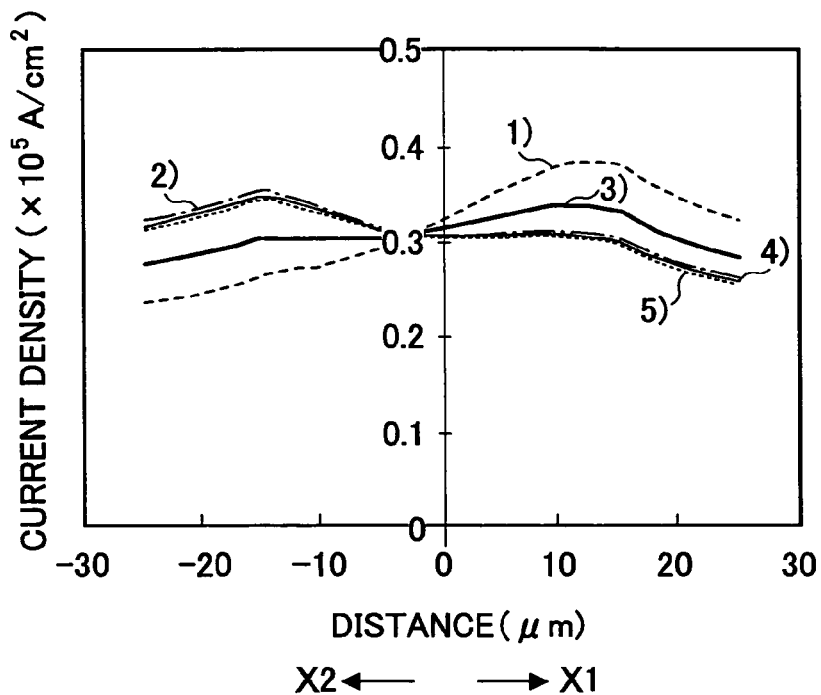
FIGS. 10A and 10B are graphs showing results of simulation of changes in a density of an electric current flowing according to a distance from a center of a bump when the column-shaped conductors are arranged as shown in FIG. 8.
Figure 10B:
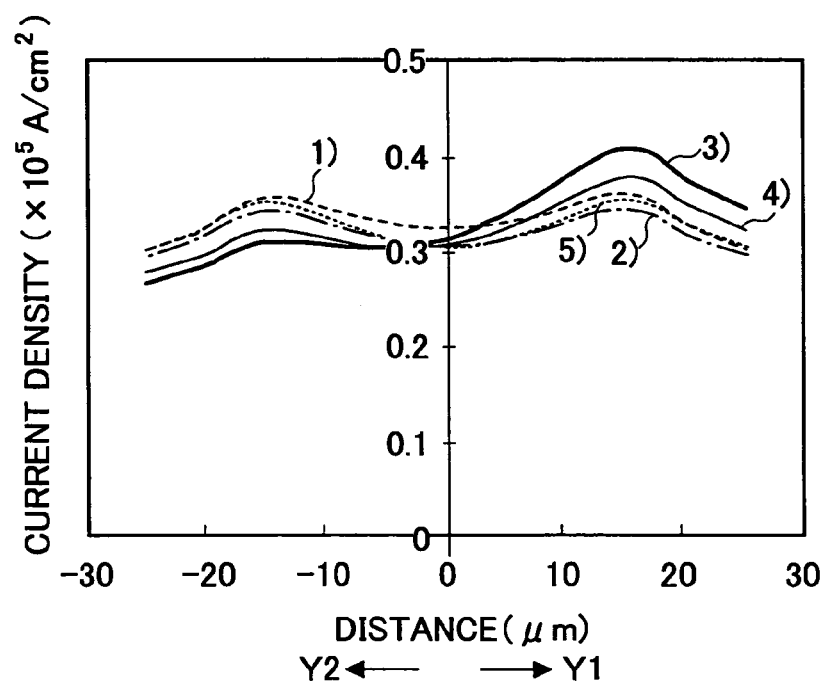

FIGS. 10A and 10B are graphs showing the results of the simulation. FIG. 10A shows a current density distribution in the X1-X2 direction, and FIG. 10B shows a current density distribution in the Y1-Y2 direction.

As shown in FIG. 10A, in the conditions 2), 4) and 5), in which the current flows in both the X1-direction and the X2-direction, the current density on the side of the X1-direction is smaller than that of the X2-direction side and the maximum current density appears on the X2-direction side. On the other hand, in the conditions 1) and 3), where a current flows only in the X1-direction along the X1-X2 direction, the electric density in the X1-direction is reduced to be smaller than that in the case 1 shown in FIG. 6 (the case where the column-shaped conductors 43 are arranged by uniformly dispersing), thereby achieving relatively uniform current density.

Moreover, as shown in FIG. 10B, in the condition 5), in which the current flows in both the Y1-direction and the X2-direction, and the conditions 1) and 2), in which the current does not flow in both the Y1-direction and the X2-direction, the curve of the current density distribution in the Y1-Y2 direction is almost flat and symmetric, and the current density is relatively uniform.

From the results of the simulation shown in FIG. 10A and FIG. 10B, it was found that when a current flows in one of the opposite directions in the case where the column-shaped conductors 43 are arranged so that the density is decreased gradually in the one of the directions, an increase in the current density in the one of the directions is suppressed. That is, in the case where an electric current flows in one of opposite directions, when the column-shaped electric conductors 43 are arranged so that the density of arrangement of the column-shaped conductors 43 is decreased gradually in the one of the opposite directions, the current density distribution can be relatively uniform.

Figure 11:
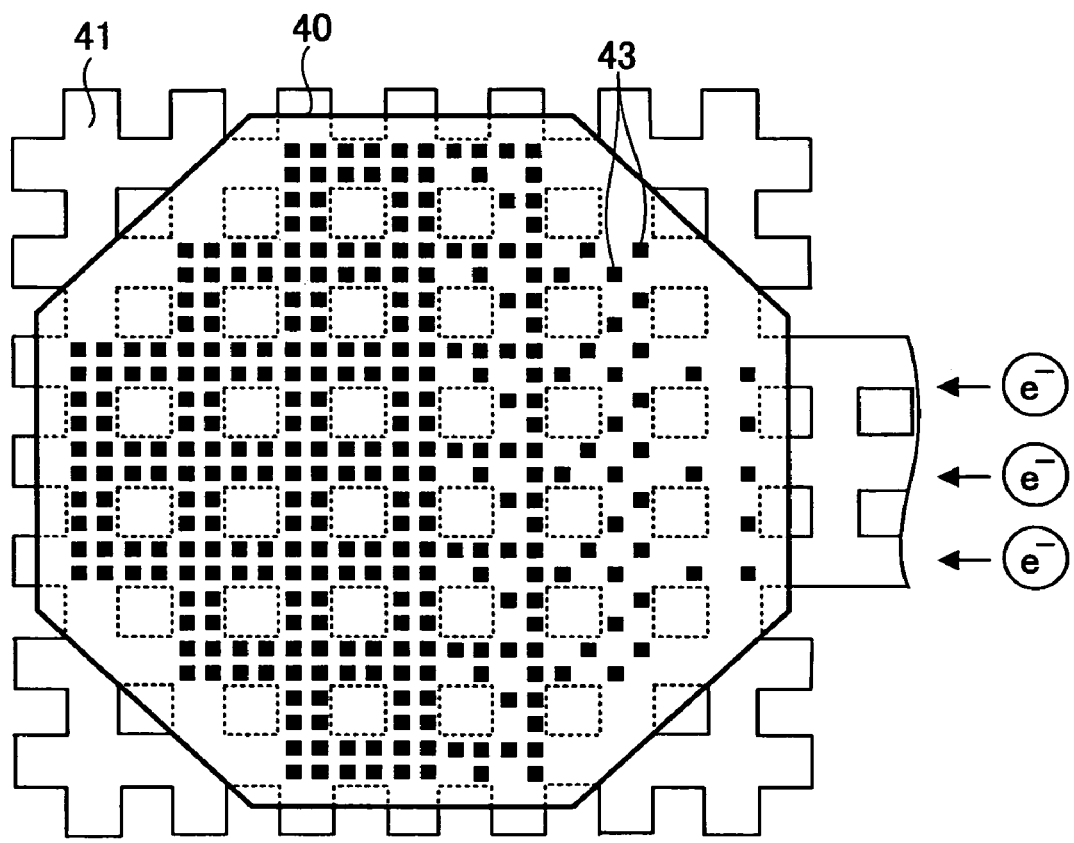
FIG. 11 is a plan view of an example in which the wiring shown in FIG. 8 is formed in a mesh pattern.

It should be noted that it is general to form the wiring layer 41 shown in FIG. 10 by copper or aluminum as mentioned above and to form the wiring layer 41 in a flat-plate shape. However, the wiring layer 41 may be formed in a mesh pattern (grid pattern) as shown in FIG. 11. In such a case, the column-shaped conductors 43 are provided on the wiring forming the mesh pattern.

Figure 12:
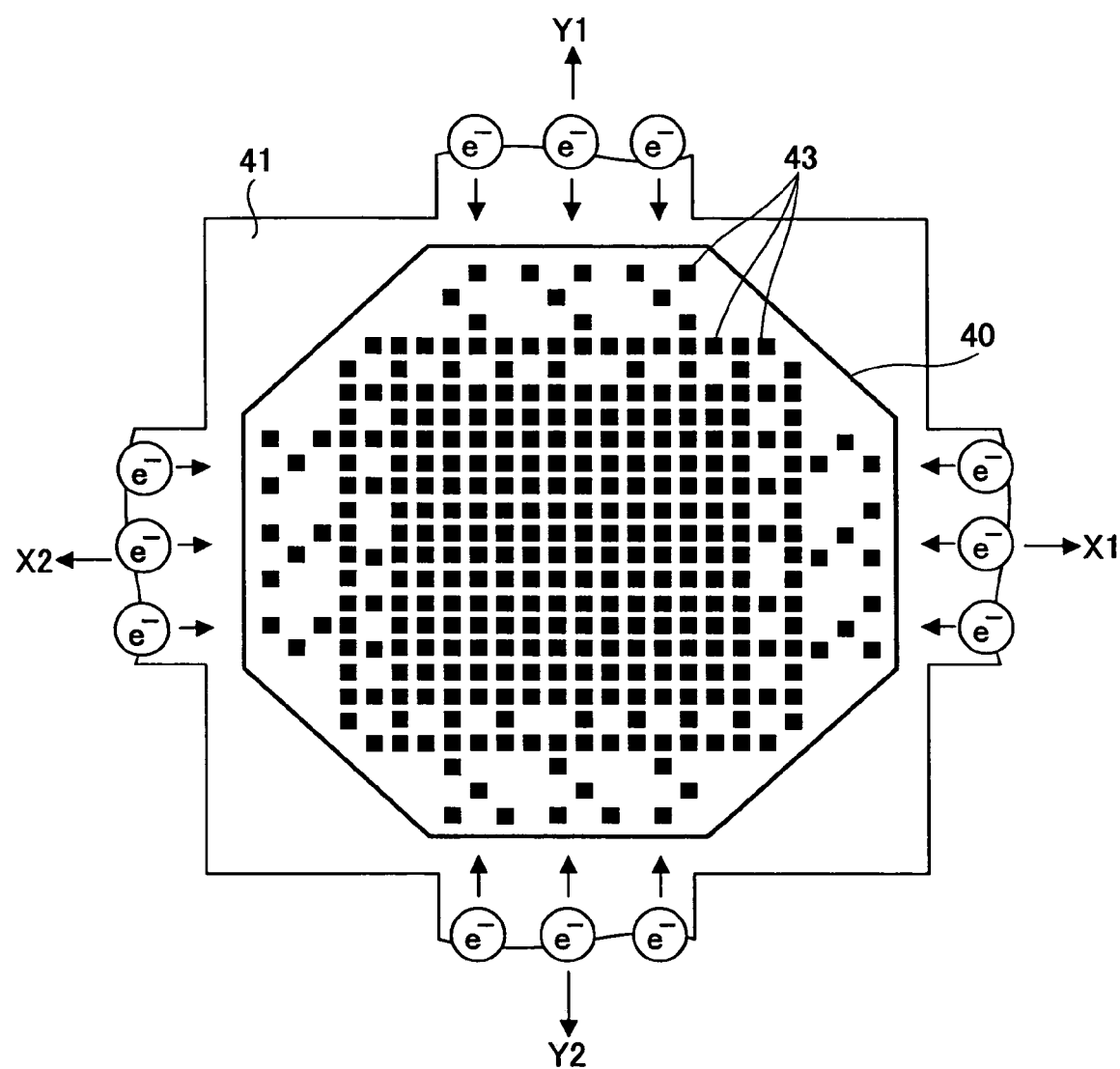
FIG. 12 is a plan view showing an arrangement of the column-shaped conductors when electrons flow from four direction.

Additionally, FIG. 12 shows an arrangement of the column-shaped conductors (tungsten plugs) 43 in a case where electrons flows into one external connection electrode terminal portion from four directions, that is, a case where wiring layers extending in four directions are connected to the external connection electrode terminal portion. Even if electrons flow into from four directions, the current density in the solder bump 37 can be uniformized by gradually decreasing the density of arrangement of the column-shaped conductors (tungsten plugs) 43 from a position corresponding to the center of the solder bump 37 in accordance with the four directions along which electrons flow.

Then, current density distributions under the following conditions were obtained by simulation using the arrangement of the column-shaped conductors (tungsten plugs) 43 shown in FIG. 12.

1) A case where a current of 600 mA flows in the X1-direction.
2) A case where a current of 300 mA flows in each of the X1-direction and the X-2 direction.
3) A case where a current of 300 mA flows in each of the X1-direction and the Y-1 direction.
4) A case where a current of 200 mA flows in each of the X1-direction, the Y-1 direction and the X-2 direction.
5) A case where a current of 150 mA flows in each of the X1-direction, the Y1-direction, the X2-direction and the Y2-direction.

In the above-mentioned cases 1)-5), the whole current flowing through the bump 37 via the foundation metal layer 36 was set to 600 mA.

Figure 13A:
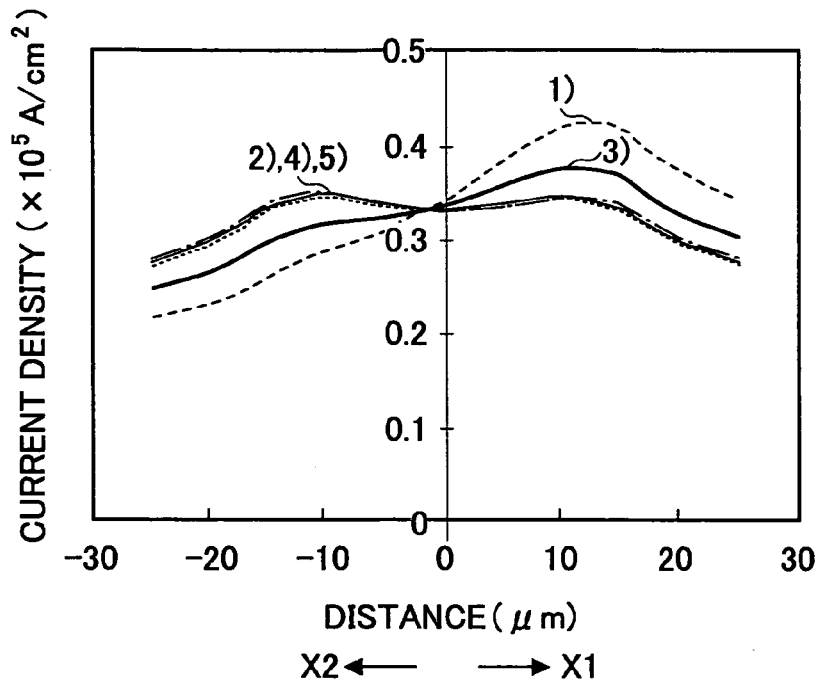
FIGS. 13A and 13B are graphs showing results of simulation of changes in a density of an electric current flowing according to a distance from a center of a bump when the column-shaped conductors are arranged as shown in FIG. 12.
Figure 13B:
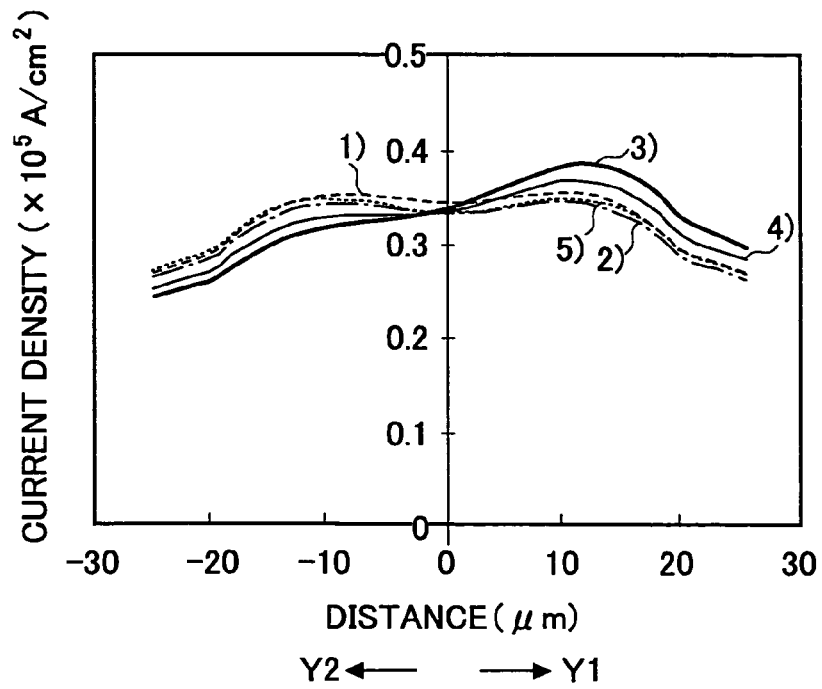

FIGS. 13A and 13B are graphs showing the results of the simulation. FIG. 13A shows a current density distribution in the X1-X2 direction, and FIG. 13B shows a current density distribution in the Y1-Y2 direction. As shown in FIG. 13A, in the conditions 2), 4) and 5), in which the current flows in both the X1-direction and the X2-direction, the curve indicating the current density distribution is almost flat and symmetric, and the current density is relatively uniform.

Moreover, as shown in FIG. 13B, in the condition 5), in which the current flows in both the Y1-direction and the X2-direction, and the conditions 1) and 2), in which the current does not flow in both the Y1-direction and the X2-direction, the curve of the current density distribution in the Y1-Y2 direction is almost flat and symmetric, and the current density is relatively uniform.

Comparing the result of the simulation shown in FIG. 13 with the result of the simulation shown in FIG. 6, the center portion (near the center of the distance of 0) of the current density distribution shown in FIG. 13 is raised in both the X1-X2 direction and the Y1-Y2 direction, which further uniformize the current density distribution.

As mentioned above, even if the direction of electrons flowing form the wiring layer 41 into the solder bump 37 is ether one direction or a plurality of directions, a current density in a joined portion of the solder bump 37 can be uniformized by gradually decreasing the density of arrangement of the column-shaped conductors (tungsten plugs) 43 toward the direction of an electric current (that is, in the direction of flow of the electric current). Thereby, a high current density area where electro-migration may occur can be eliminated, which enables suppressing generation of voids due to the electro-migration.

Figure 14:
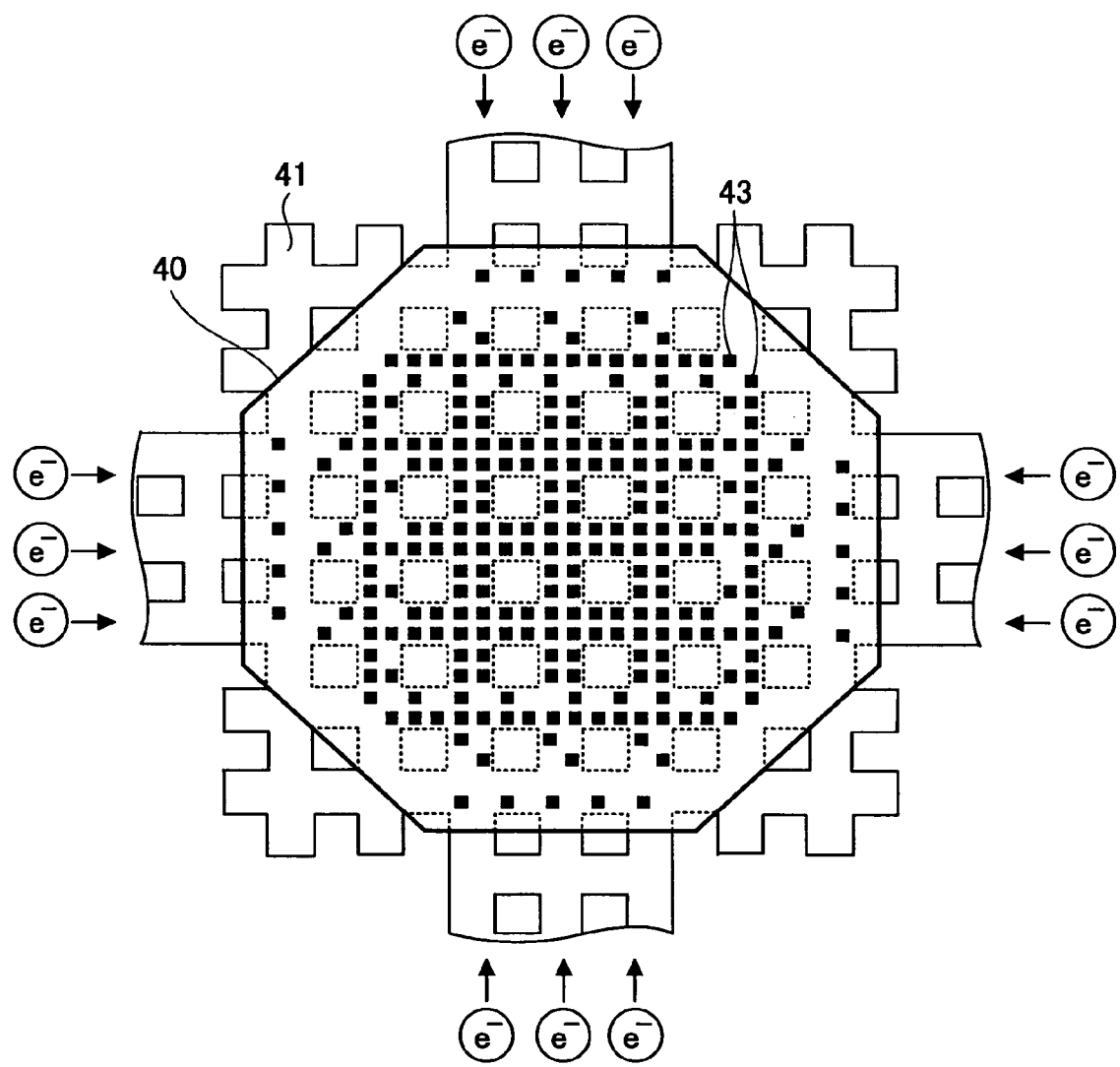
FIG. 14 is a plan view of an example in which the wiring shown in FIG. 12 is formed in a mesh pattern.

It should be noted that it is general to form the wiring layer 41 shown in FIG. 10 by copper or aluminum as mentioned above and to form the wiring layer 41 in a flat-plate shape. However, the wiring layer 41 may be formed in a mesh pattern (grid pattern) as shown in FIG. 14. In such a case, the column-shaped conductors 43 are provided on the wiring forming the mesh pattern.

It should be noted although the column-shaped conductors (tungsten plugs) 43 are arranged between the wiring layer 41 and the terminal pad portion 32 in the above-mentioned embodiment, a metal layer may further be arranged between the wiring layer 41 and the terminal pad portion 32 so that column-shaped conductors (tungsten plugs) are provided between the metal layer and the wiring layer 41 and the metal layer and the terminal pad portion 32. According to such an arrangement, the effect of uniformization of the current density by the column-shaped conductors (tungsten plugs) can be further increased.

Moreover, although the density of arrangement of the column-shaped conductors (tungsten plugs) 43 is determined based on the direction of flow of an electric current (electrons) in the above-mentioned examples, the density of arrangement of the column-shaped conductors (tungsten plugs) 43 may be determined according to a potential of the wiring layer 41 provided around the solder bump 37. If there are portions of a high-potential and a low-potential, the current density can be uniformized by gradually decreasing the density of arrangement in accordance with the high-potential portion.

Figure 15:
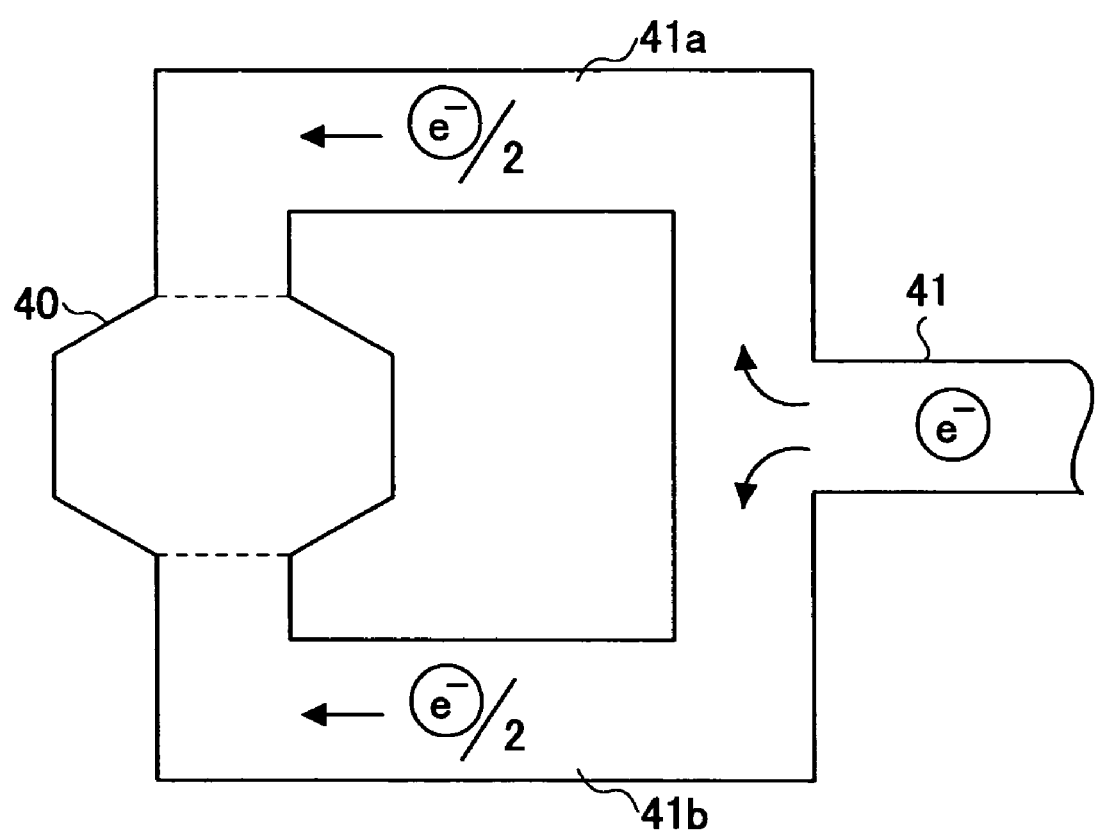
FIG. 15 is a plan view of a branched wiring layer.

Moreover, when a value of the current flowing in the wiring layer 41 connected to the external connection electrode terminal portion is large, the connecting position between the external connection electrode terminal portion and the wiring layer 41 may be dispersed, that is, the wiring layer 41 may be branched as shown in FIG. 15 so as to connect the wiring layer 41 in different directions.

In such a case, in addition to the wiring layer being branched to a plurality of branches, the density of arrangement of the column-shaped conductors 43 may be set in accordance with a plurality of connecting positions (two positions in this case) of the wiring layer 41 as mentioned above, thereby further uniformizing the current density of in the solder bump 37. Accordingly, even in a case where a larger electric current is handled, generation of electro-migration and voids due to the electro-migration can be suppresser greatly.

The current dispersion structure according to the present invention is not limited to the bump type external connection electrode terminal structure according to the above-mentioned embodiment, and is applicable, if necessary, to any electrode structure in which electro-migration and voids due to the electro-migration may occur.

The present invention is not limited to the specifically disclosed embodiments, and variations and modifications may be made without departing from the scope of the present invention.

The present invention is based on Japanese priority application No. 2005-195432 filed Jul. 4, 2005, the entire contents of which are hereby incorporated herein by reference.

What is claimed is:

1. A semiconductor device comprising:
a wiring layer provided on a semiconductor substrate and extending in a predetermined direction;
a terminal pad portion provided on said wiring layer through a plurality of column-shaped conductors;
a solder bump provided on the terminal pad portion;
an insulating layer covering said terminal pad portion and having a connection opening through which the solder bump is electrically connected to said terminal pad portion,
wherein said column-shaped conductors are arranged in an area defined by said connection opening; and
wherein a density of arrangement of said column-shaped conductors is varied based on a direction of flow of electrons flowing through said terminal pad portion and said wiring layer.

2. The semiconductor device as claimed in claim 1, wherein a density of arrangement of said column-shaped conductors is gradually decreased in accordance with the direction of extension of said wiring layer in the area defined by said connection opening between said wiring layer and said external connection electrode terminal.

3. The semiconductor device as claimed in claim 1, wherein said external connection electrode terminal is formed by a solder bump.

4. The semiconductor device as claimed in claim 3, wherein said external connection electrode terminal is configured by a solder bump having a foundation metal layer.

5. The semiconductor device as claimed in claim 1, wherein said column-shaped conductors are made of a material selected from a group consisting of tungsten, aluminum and copper.

6. The semiconductor device as claimed in claim 1, wherein said column-shaped conductors are spaced at a lower density closer to an electron source than columns located further from the electron source.

7. A semiconductor device comprising:
a wiring layer provided on a semiconductor substrate and extending in a predetermined direction; and
a terminal pad portion provided on said wiring layer through a plurality of column-shaped conductors;
a solder bump provided on the terminal pad portion,
wherein said column-shaped conductors are located under said terminal pad portion, and a density of arrangement thereof is varied according to the predetermined direction of extension of said wiring layer; and
wherein a density of arrangement of said column-shaped conductors is varied based on a direction of flow of electrons flowing through said terminal pad portion and said wiring layer.

8. The semiconductor device as claimed in claim 7, wherein said column-shaped conductors are provided in an area defined by a connection opening between said wiring layer and said external connection electrode terminal.

9. The semiconductor device as claimed in claim 8, wherein a density of arrangement of said column-shaped conductors is gradually decreased in accordance with the direction of extension of said wiring layer in the area defined by said connection opening between said wiring layer and said external connection electrode terminal.

10. The semiconductor device as claimed in claim 7, wherein said wiring layer is located under said external connection electrode terminal, and has a portion having a width larger than other portions thereof.

11. The semiconductor device as claimed in claim 7, wherein said external connection electrode terminal is formed by a solder bump.

12. The semiconductor device as claimed in claim 11, wherein said external connection electrode terminal is configured by a solder bump having a foundation metal layer.

13. The semiconductor device as claimed in claim 7, wherein said column-shaped conductors are made of a material selected from a group consisting of tungsten, aluminum and copper.

14. The semiconductor device as claimed in claim 7, wherein the density of arrangement of said column-shaped conductors is a lower density closer to an electron source than columns located further from the electron source.

15. A semiconductor device comprising:
a wiring layer provided on a semiconductor substrate via a first insulating layer and extending in a predetermined direction;
a terminal pad portion provided on said wiring layer via a second insulating layer;
a solder bump provided on the terminal pad portion;
a plurality of column-shaped conductors provided in said second insulating layer,
wherein said column-shaped conductors are located under said terminal pad portion and a density of arrangement thereof is varied according to the predetermined direction of extension of said wiring layer; and
wherein a density of arrangement of said column-shaped conductors is varied based on a direction of flow of electrons flowing through said terminal pad portion and said wiring layer.

16. The semiconductor device as claimed in claim 15, wherein said column-shaped conductors are provided in an area defined by a connection opening between said wiring layer and said external connection electrode terminal.

17. The semiconductor device as claimed in claim 16, wherein a density of arrangement of said column-shaped conductors is gradually decreased in accordance with the direction of extension of said wiring layer in the area defined by said connection opening between said wiring layer and said external connection electrode terminal.

18. The semiconductor device as claimed in claim 15, wherein said wiring layer is located under said external connection electrode terminal, and has a portion having a width larger than other portions thereof.

19. The semiconductor device as claimed in claim 15, wherein said external connection electrode terminal is formed by a solder bump.

20. The semiconductor device as claimed in claim 19, wherein said external connection electrode terminal is configured by a solder bump having a foundation metal layer.

21. The semiconductor device as claimed in claim 20, wherein said foundation metal layer includes a nickel layer contacting said solder bump, a copper layer contacting said nickel layer and a titanium layer contacting said copper layer.

22. The semiconductor device as claimed in claim 15, wherein said column-shaped conductors are made of a material selected from a group consisting of tungsten, aluminum and copper.

23. The semiconductor device as claimed in claim 15, wherein the density of arrangement of said column-shaped conductors is a lower density closer to an electron source than columns located further from the electron source.

* * * * *